(12) United States Patent
Aizar et al.

(10) Patent No.: US 7,524,087 B1
(45) Date of Patent: Apr. 28, 2009

(54) OPTICAL DEVICE

(75) Inventors: Abdul Karim Norfidathul Aizar, Penang (MY); Chiau Jin Lee, Penang (MY); Keat Chuan Ng, Penang (MY); Kiam Soon Ong, Penang (MY); Kheng Leng Tan, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/941,406

(22) Filed: Nov. 16, 2007

(51) Int. Cl.
*F21V 29/00* (2006.01)

(52) U.S. Cl. .................. 362/267; 362/310; 257/676; 257/684; 257/99; 257/100

(58) Field of Classification Search .......... 362/267, 362/310, 800; 257/678, 684, 676, 81, 82, 257/98, 99, 100
See application file for complete search history.

(56) References Cited

U.S. PATENT DOCUMENTS

| | | | | |
|---|---|---|---|---|
| 5,298,768 A | * | 3/1994 | Okazaki et al. | 257/81 |
| 6,459,130 B1 | * | 10/2002 | Arndt et al. | 257/432 |
| 6,486,543 B1 | * | 11/2002 | Sano et al. | 257/684 |
| 6,707,069 B2 | * | 3/2004 | Song et al. | 257/79 |
| 7,071,620 B2 | * | 7/2006 | Devos et al. | 313/512 |
| 7,282,740 B2 | * | 10/2007 | Chikugawa et al. | 257/79 |
| 2008/0121921 A1 | * | 5/2008 | Loh et al. | 257/99 |
| 2008/0170391 A1 | * | 7/2008 | Norfidathul et al. | 362/227 |

* cited by examiner

*Primary Examiner*—Thomas M Sember

(57) ABSTRACT

An exemplary embodiment of an optical device may include a lead frame with a plurality of leads and a reflector housing formed around the lead frame. The reflector housing includes a first end face and a second end face and a peripheral sidewall extending between the first end face and the second end face. The reflector housing includes a first pocket with a pocket opening in the first end face and a second pocket with a pocket opening in the second end face. At least one LED die is mounted in the first pocket of the reflector housing, and a light transmitting encapsulant is disposed in the first pocket and encapsulating the at least one LED die.

19 Claims, 6 Drawing Sheets

OPTICAL DEVICE

BACKGROUND

Large display panels such as stadium displays may consist of numerous small light emitting elements arranged in an array. A typical light emitting element consists of an LED die mounted in a plastic housing. However, many plastics used in LED housings are susceptible to moisture absorption from the environment which can cause the LED in the housing to fail.

Some displays also include a plastic plate surrounding the light emitting elements to hide printed circuit boards and other components and to improve contrast. These plastic plates may impose minimum height requirements for light emitting elements so that they are not obscured by the plastic plate. These height requirements complicate the design of plastic housings for light emitting elements, either increasing the mass which increases susceptibility to moisture, or resulting in flimsy housings that are prone to cracking or other physical failures.

DESCRIPTION

The drawings and description, in general, disclose an optical device, display, and a method of forming an optical assembly. In one exemplary optical device, one or more light sources such as light emitting diodes (LEDs) are mounted in a housing and may be encapsulated if desired for protection. The optical device and assembly may be taller than previous designs to meet needs of some large displays, while minimizing the mass and the moisture absorption of a housing. Failures due to moisture absorption are thus minimized. The configuration of the housing also provides for high strength to minimize cracks or other mechanical failures.

The exemplary display may include a number of optical devices, for example, mounted in a two dimensional array on a circuit board or other mounting surface. The optical devices may be surrounded by a plastic plate that either completely or partially surrounds one or more of the optical devices in the display. Alternatively, the mounting surface with optical devices may be coated in a potting material such as silicone potting. The height of the optical devices may be tall enough to avoid obscuring light output, for example, placing the light sources near a height of a top surface of the plastic plate, or placing the tops of the light sources high enough that a potting material leaves the tops of the light sources substantially uncovered.

Figure 1:
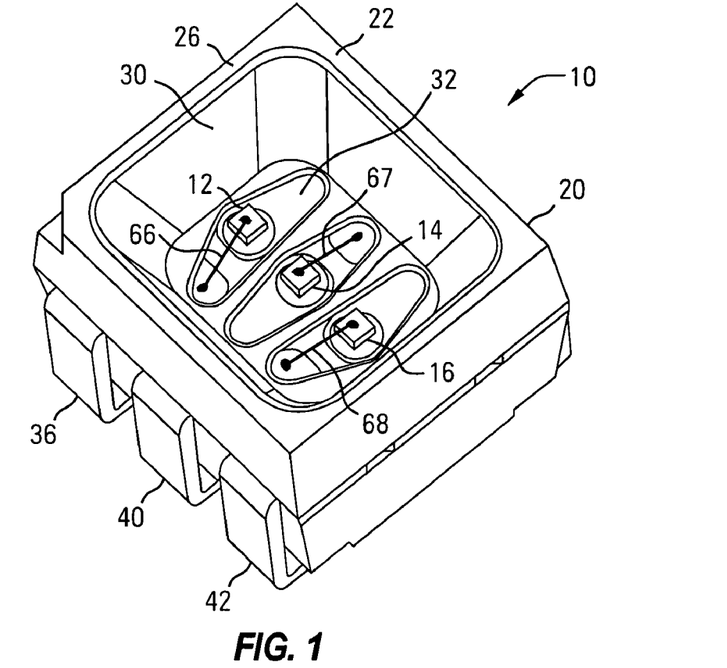
FIG. 1 is a top perspective view of an exemplary optical device.

Referring now to FIGS. 1 through 6, an exemplary optical device 10 will be described in more detail. In this embodiment, the optical device 10 comprises a plastic leaded chip carrier (PLCC) LED having six leads arranged along two sides of the PLCC housing. A top perspective view of the optical device 10 is shown in FIG. 1. One or more light sources such as LED dies 12, 14 and 16 are mounted in a reflector housing 20. The housing 20 has a top 22 (also referred to as a first end face) and a bottom 24 (FIG. 2) (also referred to as a second end face) with a peripheral wall 26 (also referred to as a sidewall) extending between the first end face 22 and second end face 24 and running around the sides of the housing 20. The LED dies 12, 14 and 16 are located in a first cavity 30 (also referred to as a pocket) formed in the first end face 22 of the reflector housing 20. The LED dies 12, 14 and 16 are mounted to an electrically conductive lead frame 32, to be discussed in more detail below. A second cavity 34 is formed on the second end face 24, reducing the overall mass of the housing 20 and thus reducing moisture absorption. The second cavity 34 is surrounded on four sides by the peripheral wall 26, providing rigidity and preventing cracks due to flexing.

The cavity 30 in which the LED dies 12, 14 and 16 are located may have angled walls to focus and direct light from the LED dies 12, 14 and 16 away from the first end face 22 of the optical device 10. The cavity 30 may also have a polished surface or a reflective coating placed on the walls to further reflect light incident on the walls from the LED dies 12, 14 and 16 into the desired direction away from the first end face 22 of the optical device 10.

The electrical connections for the optical device 10 are provided by the lead frame 32 which in the exemplary embodiment includes six leads 36, 40, 42, 44, 46 and 50. (Note that in FIG. 2, one lead 42 is omitted from the drawing to expose a lead receiving compartment 52 underneath the leads.) Each of the leads 36, 40, 42, 44, 46 and 50 are bent so that the exposed portion has a J shape enabling the optical device 10 to be mounted and soldered to a circuit board or other mounting surface using surface mount techniques such as reflow soldering. (Note that if the entire portion of the leads 36, 40, 42, 44, 46 and 50 is considered, including the portion extending within the housing 20 and to which the LED dies 12, 14 and 16 are connected, the leads 36, 40, 42, 44, 46 and 50 have a U shape.) The forming of the leads 36, 40, 42, 44, 46 and 50 in the lead frame 32 will be described in more detail below. In alternative embodiments, the leads 36, 40, 42, 44, 46 and 50 may be formed in other configurations as desired. For example, the number of leads may be altered to accommodate more or fewer light sources, or to combine connections as desired such as in a common cathode configuration in which each LED die 12, 14 and 16 has a cathode connected to a shared lead. The leads 36, 40, 42, 44, 46 and 50 may also be distributed around the housing 20 in other configurations as desired, such as with leads located on all four sides of a four-sided housing 20. The leads 36, 40, 42, 44, 46 and 50 may also be configured to enable other connection mechanisms, such as for through-hole connections using pins or cylindrical leads rather than surface mount connections using J shaped flat leads.

Figure 2:
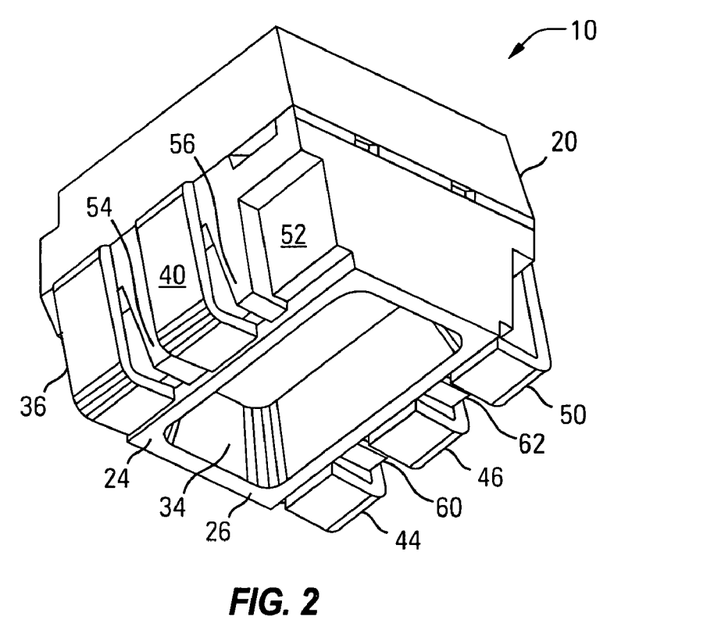
FIG. 2 is a bottom perspective view of an exemplary optical device.
Figure 3:
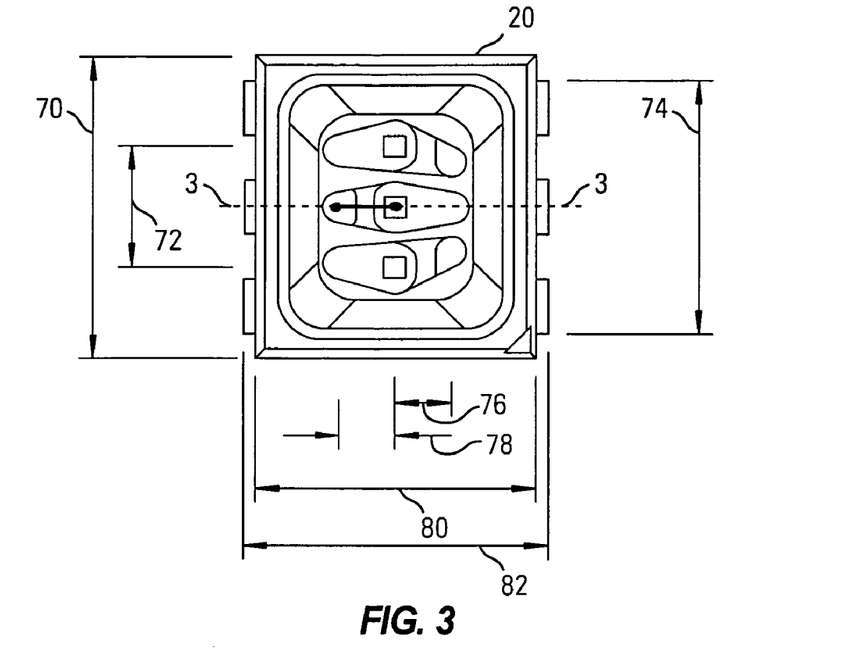
FIG. 3 is a top view of an exemplary optical device.
Figure 4:
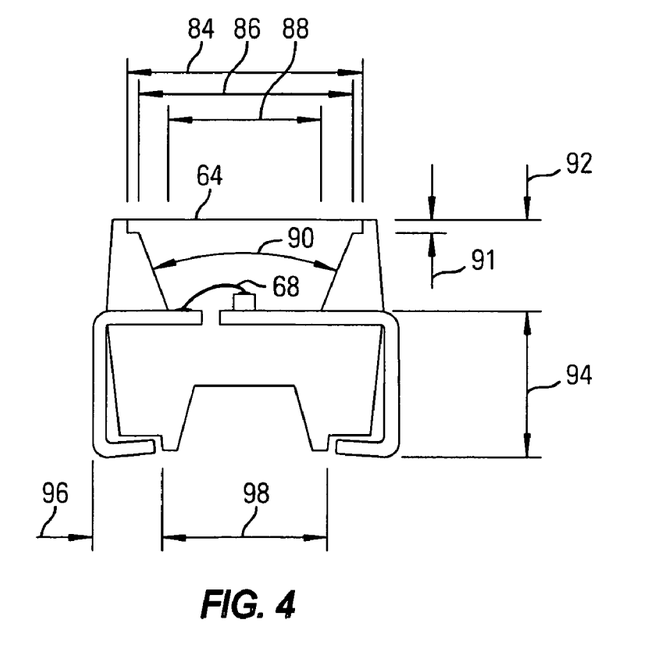
FIG. 4 is a cross-sectional end view of the exemplary optical device of FIG. 3 taken along line 3-3.
Figure 5:
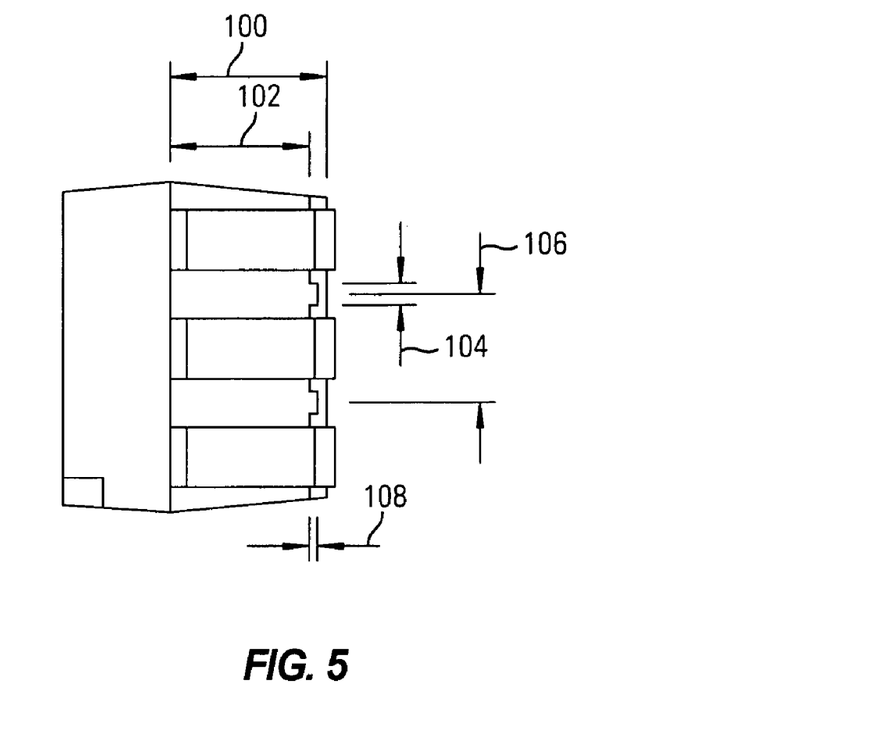
FIG. 5 is a side view of the exemplary optical device of FIG. 3.
Figure 6:
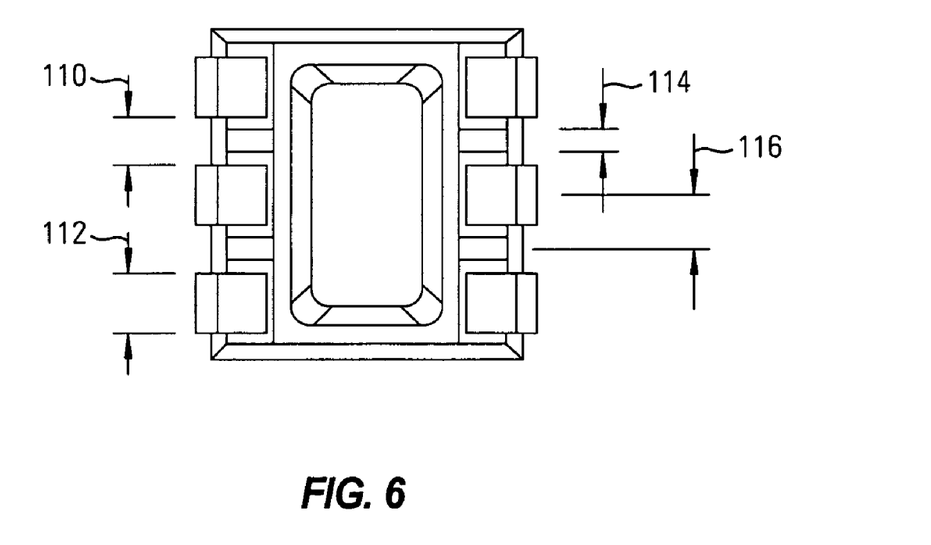
FIG. 6 is a bottom view of the exemplary optical device of FIG. 3.

Each of the leads 36, 40, 42, 44, 46 and 50 of the exemplary embodiment is located over a cavity or lead receiving compartment (e.g., 52) formed in the exterior of the peripheral wall 26. The lead receiving compartments (e.g., 52) reduce the mass of the housing 20 and limiting inward deflection of the leads 36, 40, 42, 44, 46 and 50. In one exemplary embodiment, the combined volume of the bottom cavity 34 and lead receiving compartments is at least about 50% of the volume of the top cavity 30. The lead receiving compartment may be J shaped to match the shape of the leads 36, 40, 42, 44, 46 and 50, enabling the leads 36, 40, 42, 44, 46 and 50 to fit within and facilitating the bending of the leads 36, 40, 42, 44, 46 and 50 into the desired J shape. Each of the cavities (e.g., 52) under the leads 36, 40, 42, 44, 46 and 50 is separated by ribs 54, 56, 60 and 62 formed in the peripheral wall 26 of the housing 20. The ribs separate the leads 36, 40, 42, 44, 46 and 50 and prevent short circuits, increase the strength of the housing 20, and prevent the leads 36, 40, 42, 44, 46 and 50 from twisting, particularly while the leads 36, 40, 42, 44, 46 and 50 are being bent into a J shape.

The exemplary bottom cavity 34 is surrounded on all four sides by the peripheral wall 26, rather than just forming a slot and having the slot bounded by the peripheral wall 26 only on the two sides with leads. The fully bounded cavity 34 is stronger than a slot and prevents cracking during bending of the leads to form the J shape. The fully bounded cavity 34 also forms a stable platform for the optical device 10 so that it is less likely to tip over during the assembly and mounting process.

The cavity 30 formed in the first end face 22 of the reflector housing 20 may be filled with an encapsulant 64 (see FIG. 4) to cover and protect the LED dies 12, 14 and 16 if desired. For example, a substantially transparent silicone material may be used as an encapsulant 64. Any material that can be held within the cavity 30 and that substantially transmits light through itself may be used as the encapsulant 64, and particularly materials that adhere uniformly within the cavity 30 and prevent moisture from reaching the LED dies 12, 14 and 16.

The type, color and number of light sources placed within the cavity 30 of the reflector housing 20 in the optical device 10 may be varied as desired. In one exemplary embodiment, a substantially white optical device 10 may be formed by including a red, a green and a blue LED die (e.g., 12, 14 and 16) that visually combine to form a white overall output from each individual optical device 10. Alternatively, an overall white light may be formed in a display using multiple optical devices that do not individually produce white light. For example, an optical device having one or more red light sources may be combined with a second optical device having one or more green light sources and a third optical device having one or more blue light sources. Each optical device 20 may include a single light source, two light sources, or three light sources, etc. as desired. The placement of the light sources within the cavity 30 of the reflector housing 20 in the optical device 10 may also be varied as desired. For example, FIG. 1 illustrates an exemplary embodiment in which three LED dies 12, 14 and 16 are substantially aligned in a straight line. In an alternative embodiment, the light sources may be placed in other configurations as desired to meet various needs, such as increasing the perceived uniformity of an overall white light. For example, the LED dies 12, 14 and 16 may be placed in a triangle. Multiple optical devices having different configurations of light sources may also be variously arranged and combined together to increase the perceived uniformity of an overall light of a given color such as white.

The LED dies 12, 14 and 16 or other light sources may be physically attached within the cavity 30 of the reflector housing 20 in the optical device 10 to the lead frame 32, the reflector housing 20 itself, or to another structure that holds the light sources in the desired location. The LED dies 12, 14 and 16 may be physically attached using an adhesive, a solder joint, or a combination of these or other connection techniques. For example, the LED dies 12, 14 and 16 may also be held in place either partially or fully by the encapsulant 64. The LED dies 12, 14 and 16 may be electrically connected to the lead frame 32 either by one, two or more wire bonds between each LED die and an appropriate lead in the lead frame 32, or by a solder connection between a pad such as a PN junction on the LED die and a lead in the lead frame 32, or by a combination of these or other electrical connection techniques.

Dimensions of an exemplary embodiment illustrated in FIGS. 3-6 are contained in Table 1 below. The exemplary dimensions may lie within acceptable ranges or tolerances, may be scaled or adapted as desired and are not to be viewed as limiting. The dimensions contained in Table 1 are in millimeters unless otherwise indicated.

TABLE 1

| | |
|---|---|
| 70 | 4.4 |
| 72 | 1.8 |
| 74 | 3.7 |
| 76 | 0.79 |
| 78 | 0.83 |
| 80 | 4 |
| 82 | 4.4 |
| 84 | 3.4 |
| 86 | 3.08 |
| 88 | 2.29 |
| 90 | 42° |
| 91 | 0.2 |
| 92 | 1.35 |
| 94 | 2.16 |
| 96 | 0.9 |
| 98 | 2.4 |
| 100 | 2.07 |
| 102 | 1.85 |
| 104 | 0.3 |
| 106 | 1.45 |
| 108 | 0.1 |
| 110 | 0.65 |
| 112 | 0.8 |
| 114 | 0.3 |
| 116 | 0.7 |

Figure 7:
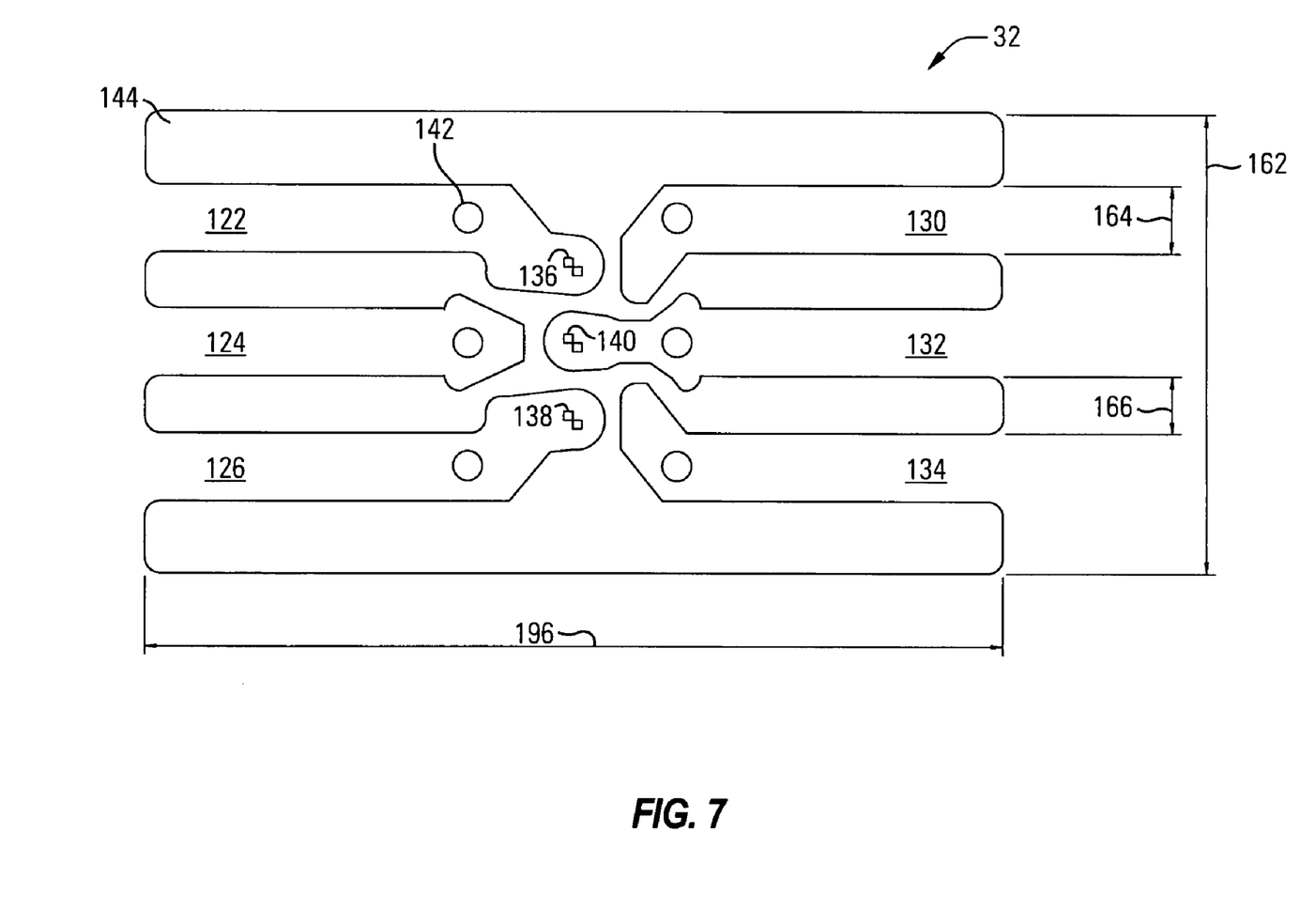
FIG. 7 is an exemplary portion of a lead frame plate corresponding to a single optical device.
Figure 8:
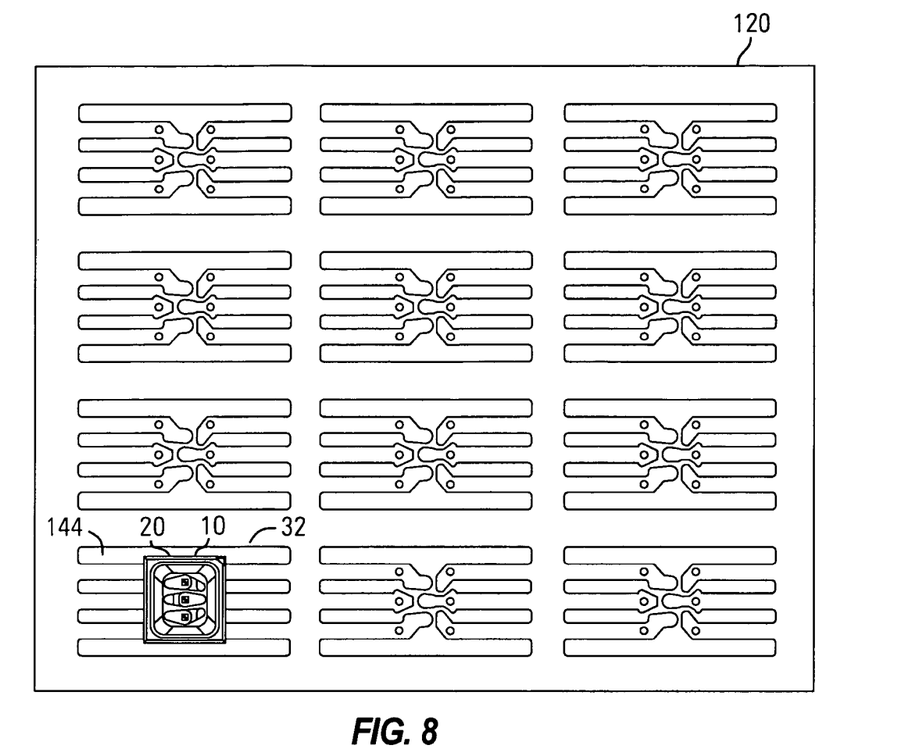
FIG. 8 is an exemplary lead frame plate.

Referring now to FIGS. 7 and 8, the exemplary formation of leads in an optical device 10 will be described. A lead frame 32 for a single optical device 10 may be formed in a lead frame plate 120, simplifying the creation of lead frames for multiple optical devices. The use of a lead frame 32 and lead frame plate 120 holds the individual leads in place while the reflective housing 20 is formed around the leads by molding or other suitable processes. The exemplary lead frame 32 with six leads 122, 124, 126, 130, 132 and 134 is illustrated in FIG. 7. The shape and length of each lead 122, 124, 126, 130, 132 and 134 may be configured as desired based on the placement of the LED dies 12, 14 and 16. Dimples or roughened areas 136, 138 and 140 may be stamped or otherwise formed in the leads (e.g., 122, 126 and 132) to facilitate mounting and soldering the LED dies 12, 14 and 16. Holes (e.g., 142) may also be formed in the leads 122, 124, 126, 130, 132 and 134 if desired so that the plastic material in the reflective housing 20 can pass through and fill the holes (e.g., 142) during the molding process to hold the leads 122, 124, 126, 130, 132 and 134 in place within the optical device 10.

The leads 122, 124, 126, 130, 132 and 134 are formed in the lead frame 32 by stamping or cutting an opening 144 in the lead frame plate 120, leaving the leads 122, 124, 126, 130, 132 and 134 defined by the opening 144. The leads 122, 124, 126, 130, 132 and 134 are still held in place by the lead frame plate 120 so that the reflective housings (e.g., 20) can be molded over the leads on the lead frame plate 120. Thus, multiple reflective housings (e.g., 20) may be formed on a single lead frame plate 120. The leads 122, 124, 126, 130, 132 and 134 can then later be cut away from the lead frame plate 120, freeing each optical device (e.g., 10) from the lead frame plate 120 and separating each lead (e.g., 122) from the others (e.g., 124-134). One reflective housing 20 with LED dies is shown on the lead frame plate 120 of FIG. 8 to illustrate the placement of reflective housings on the lead frame plate 120. However, during actual fabrication, multiple reflective housings may be formed simultaneously or otherwise on the lead frame plate 120 by injection molding or other suitable processes. LED dies (e.g., 12, 14 and 16) or other light sources may be attached in the reflective housings (e.g., 20) either while the lead frames (e.g., 32) remain connected to the lead frame plate 120 or after they have been cut away.

Dimensions of an exemplary embodiment of a lead frame 32 illustrated in FIG. 7 are contained in Table 2 below. Again, the exemplary dimensions may lie within acceptable ranges or tolerances, may be scaled or adapted as desired and are not to be viewed as limiting. The dimensions contained in Table 2 are in millimeters unless otherwise indicated.

TABLE 2

| | |
|---|---|
| 164 | 0.8 |
| 166 | 0.65 |
| 196 | 10.2 |

Figure 9:
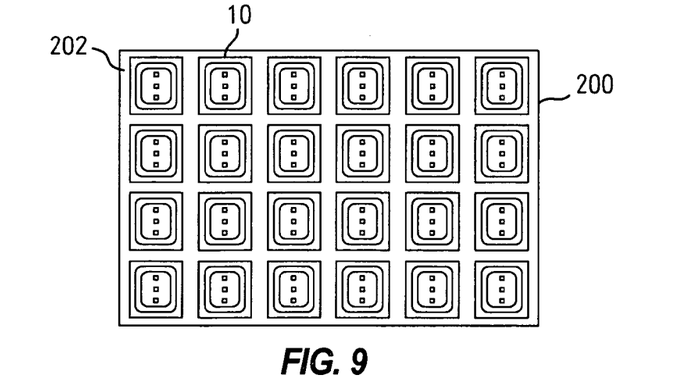
FIG. 9 is an exemplary display.
Figure 10:
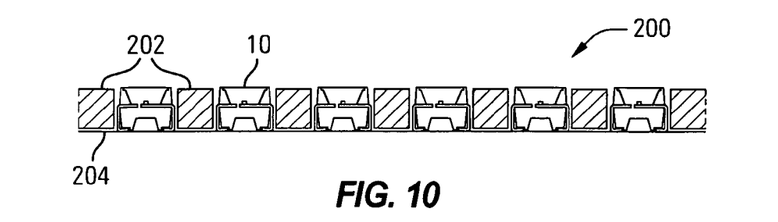
FIG. 10 is a side view of an exemplary display illustrating an exemplary plate or potting material surrounding optical devices in the display.

An exemplary display 200 including an array of optical devices (e.g., 10) is illustrated in FIG. 9. For example, large stadium displays may be formed by a two dimensional array of optical devices (e.g., 10) as described above. Any spaces between the optical devices (e.g., 10) may filled by a plate or potting material 202 or other suitable materials. For example, the optical devices (e.g., 10) may be at least partially surrounded and separated by a plate 202 made of any suitable material such as plastic or metal. The plate 202 may have a dark or black coating if desired to increase the black level and apparent contrast of the display 200. Alternatively, a potting material 202 may be used to fill the spaces between the optical devices (e.g., 10), for example, a silicone potting material. As with the plate, the silicone potting material may have a dark or black coating if desired to increase the black level and apparent contrast of the display 200. The plate or potting material 202 may be used to fill spaces left by the manufacturing process in which the optical devices (e.g., 10) are connected to a mounting surface such as a circuit board, and may also act to protect the mounting surface and optical devices (e.g., 10) from moisture or other environmental hazards. A side view of an exemplary display 200 is shown in FIG. 10, in which optical devices (e.g., 10) are mounted to a circuit board or other mounting surface 204 and surrounded by a plate or potting material 202.

Figure 11:
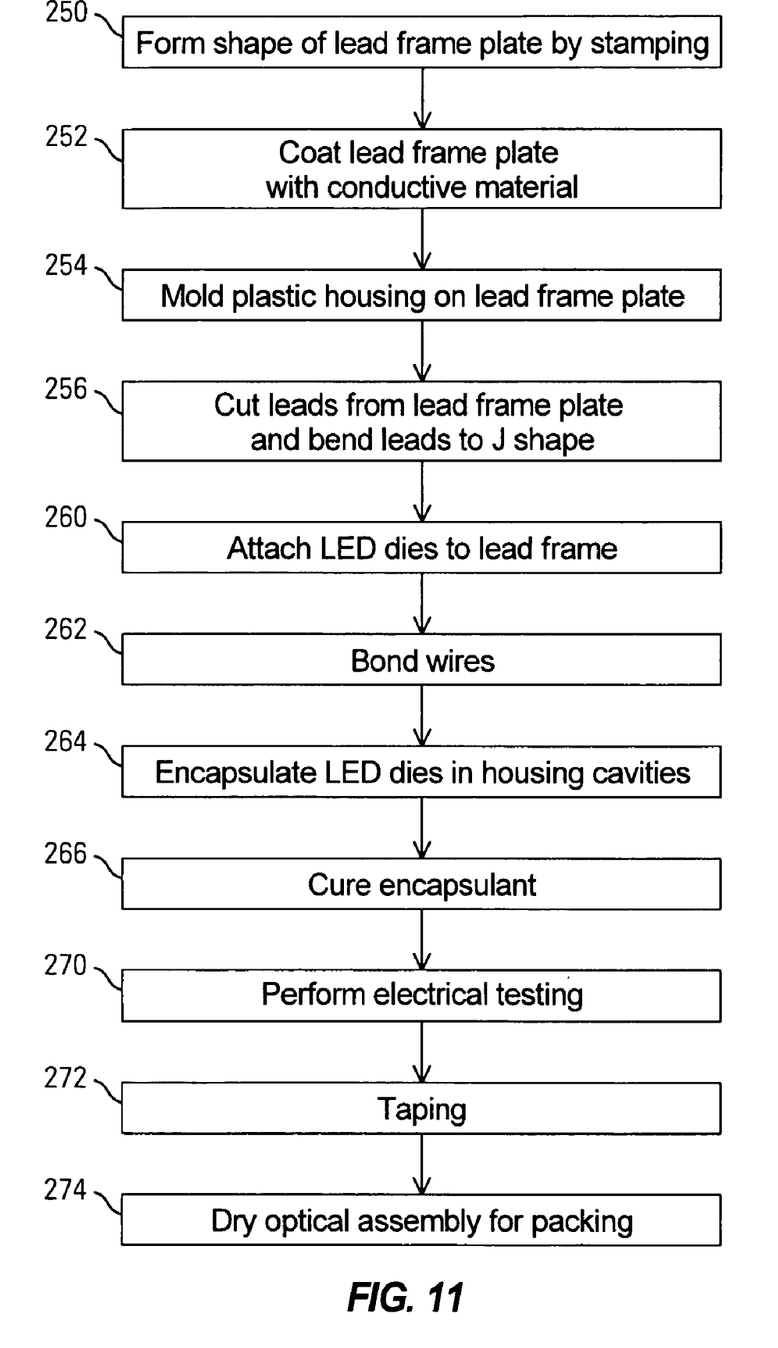
FIG. 11 is a flowchart of an exemplary operation for forming an optical assembly.

An exemplary method of forming an optical assembly is summarized in the flow chart of FIG. 11. A lead frame plate is formed 250 by cutting or stamping the shape into a copper sheet or other suitable material. The lead frame plate may be coated 252 with another conductive material such as silver if desired to enhance conductivity though connections to the leads. One or more plastic housings may be formed 254 on the lead frame plate, such as by injection molding. The plastic housings may be formed using any suitable material, such as polyphthalamide. The leads are cut 256 from the lead frame plate and bent into a J shape or otherwise formed into any desired shape. Light sources such as LED dies are attached 260 to each lead frame, and wires are bonded 262 as needed to the LED dies to electrically connect the LED dies to the lead frame. The LED dies may be encapsulated 264 in the housing cavities, such as with a substantially transparent silicone material, and the encapsulant may be cured 266 if needed. The optical devices 10 may be electrically tested 270, taping 272 and any other finishing steps may be performed, and the optical devices 10 may be dried 274 for packing.

The optical device, display, and a method of forming an optical assembly described herein provides a reliable source of light while reducing the mass of the housing and the susceptibility to moisture absorption. The optical device housing may be made relatively tall if desired to meet the design specifications for a display, thus avoiding obscuring the light sources by plates or potting materials used to surround the optical devices in the display.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. An optical device comprising:
   a lead frame with a plurality of leads;
   a reflector housing formed around the lead frame, the reflector housing having a first end face and a second end face and a peripheral sidewall extending between the first end face and the second end face, the reflector housing having a first pocket with a pocket opening in the first end face and a second pocket with a pocket opening in the second end face;
   at least one LED die mounted in the first pocket of the reflector housing;
   a light transmitting encapsulant disposed in the first pocket and encapsulating the at least one LED die; and
   wherein a plurality of lead receiving compartments are formed in the peripheral sidewall of the reflector housing.

2. The optical device of claim 1, wherein the combined volume of the second pocket and the lead receiving compartments is at least 50% of the volume of the first pocket.

3. The optical device of claim 2, said plurality of leads being J-shaped.

4. The optical device of claim 2, said plurality of leads comprising six leads in two rows.

5. The optical device of claim 2, said plurality of lead receiving compartments being J-shaped.

6. The optical device of claim 1, wherein the plurality of lead receiving compartments define a plurality of ribs disposed between the plurality of lead receiving compartments.

7. The optical device of claim 1, said at least one LED die comprising three LED dies.

8. The optical device of claim 7, said three LED dies comprising at least two colors.

9. A display comprising a plurality of plastic leaded chip carrier LEDs, the plastic leaded chip carrier LEDs each comprising:
   a lead frame with a plurality of leads;
   a reflector housing formed around the lead frame, the reflector housing having a first end face and a second end face and a peripheral sidewall extending between the first end face and the second end face, the reflector housing having a cavity in the first end face, said peripheral sidewall having a plurality of lead receiving compartments formed therein;
   at least one LED die mounted in the cavity of the reflector housing; and a light transmitting encapsulant disposed in the cavity and encapsulating the at least one LED die.

10. The display of claim 9, said reflector housing further comprising a second cavity in the second end face.

11. The display of claim 10, wherein the plurality of lead receiving compartments define a plurality of ribs disposed between the plurality of lead receiving compartments.

12. The display of claim 11, said plurality of leads being J-shaped.

13. The display of claim 9, wherein said lead receiving compartments limit inward deflection of said plurality of leads.

14. The display of claim 9, wherein said display comprises a stadium display.

15. An illumination system, comprising:
   a reflector housing molded on a lead frame having a plurality of electrically conductive leads, the reflector housing having a first cavity and a second cavity on opposite sides of the reflector housing;
   at least one LED die mounted in said first cavity and electrically connected to said plurality of electrically conductive leads; and
   said reflector housing further having a first end face and a second end face and a peripheral sidewall extending between the first end face and the second end face, the reflector housing having a cavity in the first end face, said peripheral sidewall having a plurality of lead receiving compartments formed therein.

16. The illumination system of claim 15, wherein said plurality of electrically conductive leads have a J-shape.

17. The illumination system of claim 15, further comprising an encapsulant filling said first cavity around said at least one LED die.

18. The illumination system of claim 15, further comprising a plurality of other reflector housings each having at least one LED die mounted, said reflector housing and said plurality of other reflector housings arranged in an array in a display.

19. The illumination system of claim 18, said display comprising a stadium display.

* * * * *